United States Patent
Ju

(10) Patent No.: US 7,601,012 B2
(45) Date of Patent: Oct. 13, 2009

(54) SOCKET CONNECTOR

(76) Inventor: Ted Ju, P.O. Box 26-757, Taipei (TW) 106

( * ) Notice: Subject to any disclaimer, the term of this patent is extended or adjusted under 35 U.S.C. 154(b) by 0 days.

(21) Appl. No.: 11/000,889

(22) Filed: Dec. 2, 2004

(65) Prior Publication Data

US 2005/0079745 A1    Apr. 14, 2005

Related U.S. Application Data

(63) Continuation-in-part of application No. 10/627,268, filed on Jul. 24, 2003, now abandoned.

(51) Int. Cl.
*H01R 12/00* (2006.01)
(52) U.S. Cl. ............................................ 439/83
(58) Field of Classification Search .................. 439/83, 439/876; 228/180.21
See application file for complete search history.

(56) References Cited

U.S. PATENT DOCUMENTS

| | | | |
|---|---|---|---|
| 5,930,889 A * | 8/1999 | Klein | 29/840 |
| 5,936,848 A * | 8/1999 | Mehr et al. | 361/777 |
| 6,454,157 B2 * | 9/2002 | Olson | 228/180.21 |
| 6,695,628 B2 * | 2/2004 | Yeh | 439/83 |

* cited by examiner

*Primary Examiner*—Phuong Dinh
(74) *Attorney, Agent, or Firm*—Troxell Law Office, PLLC

(57) ABSTRACT

A socket connector is bonded to a circuit board by solder materials. The solder materials are well arranged so that no short circuits occur. The socket connector can be applied in a wide range of uses with high yield and reduced cost. The socket connector has an insulative housing having a plurality of terminals and a solder material therein. The socket connector is characterized by the insulative housing being provided with a plurality of overflow holes in a direction along which the insulative housing and terminals apply pressure to the solder material.

2 Claims, 7 Drawing Sheets

SOCKET CONNECTOR

CROSS-REFERENCE TO RELATED APPLICATIONS

This Application is a Continuation-in-Part of application Ser. No. 10/627,268, filed Jul. 24, 2003 now abandoned, and entitled SOCKET CONNECTOR.

BACKGROUND OF THE INVENTION

1. Field of the Invention

The invention relates to a socket connector, and more particularly to a socket connector having an insulative housing with a stopper, the stopper having an overflow hole formed therein.

2. Description of the Related Art

Referring to FIG. 1 and FIG. 2, a conventional socket connector includes an insulative housing 2 with a plurality of sockets 1, a terminal 3 and a plurality of solder materials 4 located inside the sockets 1. In order to prevent the solder material 4 from climbing up along the terminals 3 after being melted, which may result in soldering failure, a stopper 5 is formed in each socket 1. However, this causes another problem: the solder material 4 is squeezed by a circuit board 6 to flow upward if the circuit board 6 is not perfectly flat. There is no space to accommodate the solder material or to ventilate the air 7, so that the solder material 4 is forced to flow out through sides of the corresponding socket 1. In this manner, the solder material in adjacent sockets 1 may come into contact with one another to cause a short circuit and degrade electrical performance. FIG. 3 and FIG. 4 illustrate another conventional socket connector in which a tail of each of terminals 8 is bent horizontally to prevent soldering failure; however, contact of solder materials 9 in adjacent sockets still occurs to cause short circuits and degrade electrical performance.

U.S. Pat. No. 2003/0216067 discloses a battery connector. The battery connector includes a number of connector blocks 1. Each of connector blocks 1 has an insulative housing 10 and a terminal 3 retained therein. The terminal 3 projects beyond a mating face 11 of the insulative housing 10 to couple with complementary contacts. Each terminal 3 forms a base section 32 with a hole 321 for facilitating soldering of the terminal 3 to a PCB. The provision of the hole 321 promotes an efficient and accurate surface mounting process whereby excessive solder will not overflow beyond outer edges of the base section 32 of the terminal 3 resulting in a possible short circuit. However, during the surface mounting process, the excessive solder will quickly flow into the housing from the hole 321 of the terminal, so that any part of the solder will generate great temperature difference. Furthermore, the insulative housing 10 has a pair of apertures 18 for positioning a pair of protrusions 331 of the terminal 3, and the terminal 3 projected out the insulative housing 10. Hence, the connector blocks 1 cannot arrange together in matrix shaped.

SUMMARY OF THE INVENTION

It is therefore an object of the invention to provide a socket connector that prevents solder material in adjacent sockets from coming into contact with one another and, thereby, prevents short circuit.

In order to achieve the above and other objectives, the socket connector of the invention includes an insulative housing, a plurality of terminals and solder materials. The insulative housing has a plurality of longitudinal terminal slots arranged adjacent to one another, and a plurality of stoppers. Each of the stoppers is protruded inwardly from one interior surface of each terminal slot, and has an overflow hole formed therein. Each of the terminals has a contact section projected out an upper opening of each terminal slot, a fixed section being fixed between each stopper and other interior surface of each terminal slot, and a soldering section projected out a lower opening of each terminal slot. The solder materials are located in each overflow hole, and covered around each soldering section during a soldering procedure. Wherein, during the soldering procedure, any parts of the solder material are able to receive outside temperature of the insulative housing from the upper opening and the lower opening of each terminal slot, respectively. During the soldering procedure, the solder material automatically flows from the lower opening of each terminal slot into each overflow hole.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
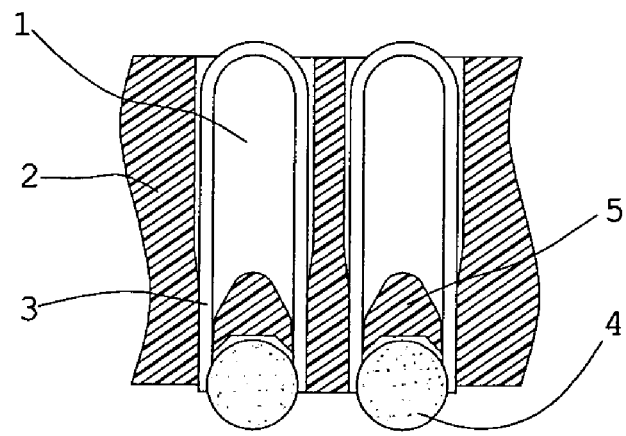
FIG. 1 is a cross-sectional view of a portion of the conventional socket connector.
Figure 2:
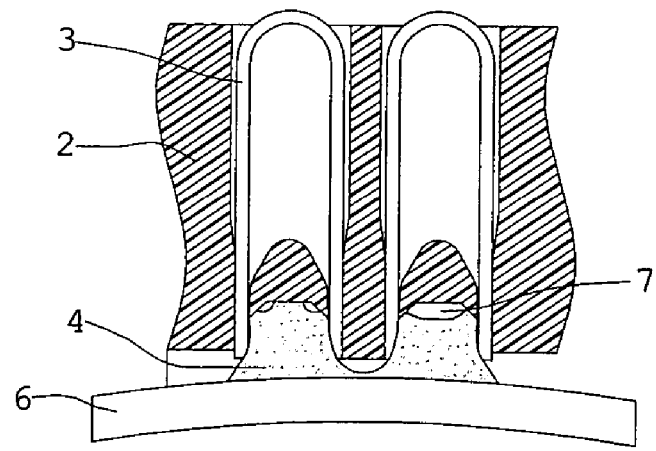
FIG. 2 is a cross-sectional view of a portion of the conventional socket connector.
Figure 3:
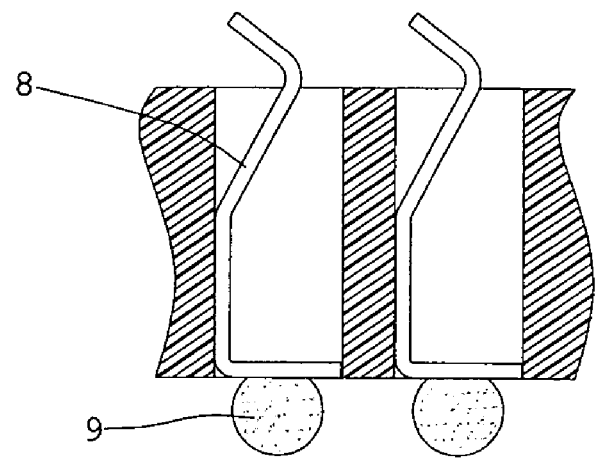
FIG. 3 is a cross-sectional view of a portion of another conventional socket connector.
Figure 4:
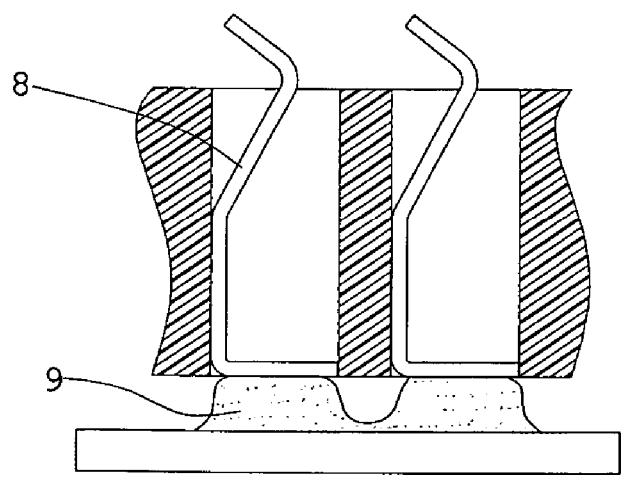
FIG. 4 is a cross-sectional view illustrating the conventional socket connector bonded to a circuit board.
Figure 5:
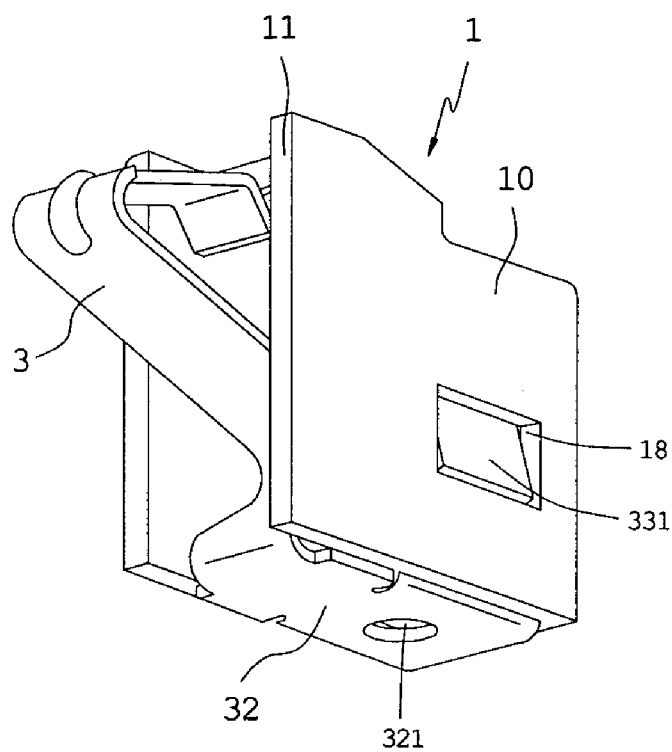
FIG. 5 is a perspective view of the battery socket connector.

Wherever possible in the following description, like reference numerals will refer to like elements and parts unless otherwise illustrated.

Figure 6:
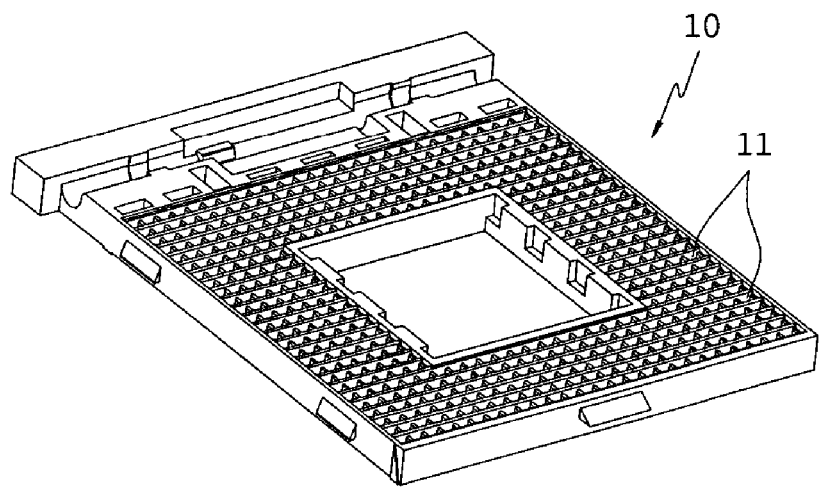
FIG. 6 is a perspective, assembled view of the insulative housing of the socket connector according to the invention.

FIG. 6 shows a perspective, assembled view of the insulative housing of the socket connector according to the invention. The socket connector includes an insulative housing 10 having a plurality of longitudinal terminal slots 11 arranged adjacent to one another.

Figure 7:
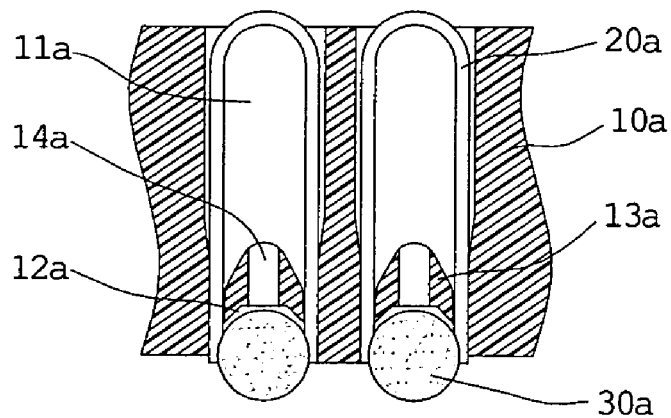
FIG. 7 is a cross-sectional view of a portion of the socket connector according to a first embodiment of the invention.
Figure 8:
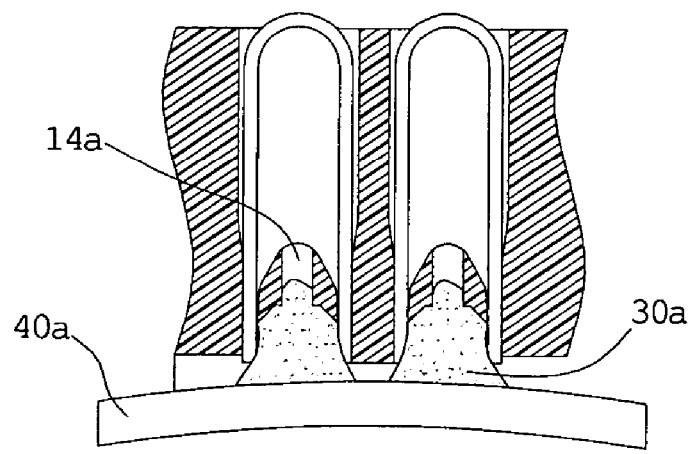
FIG. 8 is a cross-sectional view illustrating the socket connector bonded to a circuit board according to a first embodiment of the invention.

Referring to FIG. 7 and FIG. 8, the present invention provides a socket connector. The socket connector includes an insulative housing 10a having a plurality of terminal slots 11a. A plurality of reversed U-shaped terminals 20a and solder materials 30 are respectively mounted inside the terminal slots 11a. A stopper 13a is formed inside each terminal slot 11a to contact with a tip of each terminal 20a. An accommodating space 12a is defined above the stopper 13a for receiving solder materials 30a. An overflow hole 14a is formed approximately at a center of stopper 13a. When the circuit board 40a is to be assembled, the solder material 30a is melted. If the circuit board 40a is not perfectly flat, then the solder material 30a is squeezed and consequently spreads out. With the overflow holes 14a, the solder materials 30a flow along the overflow holes 14a, preventing the solder materials 30a from spreading and, consequently, avoiding a short circuit. Thereby, electrical performance of the socket connector is ensured.

Figure 9:
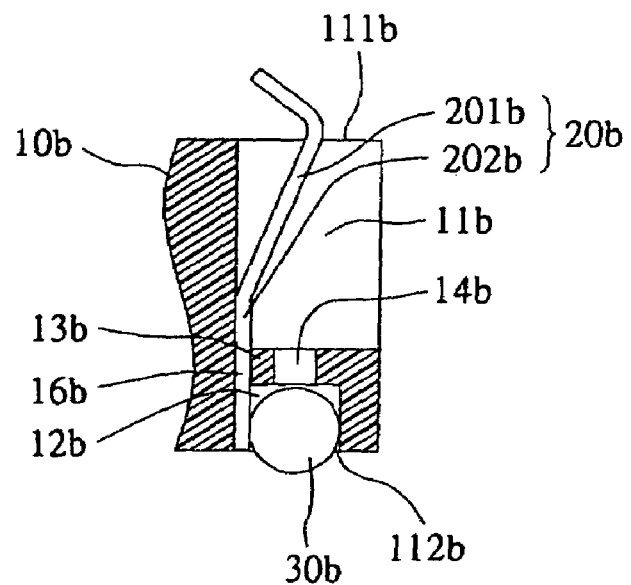
FIG. 9 is a cross-sectional view of a portion of the socket connector according to a second embodiment of the invention.

Referring to FIG. 9, the present invention provides a socket connector. The socket connector includes an insulative housing 10b, a plurality of terminals 20b and solder materials 30b. The insulative housing 10b has a plurality of longitudinal terminal slots 11b arranged adjacent to one another, and a plurality of stoppers 13b. Each of the stoppers 13b is protruded inwardly from one interior surface of each terminal slot 11b, and has an overflow hole 14b formed therein.

Each of the terminals 20b has a contact section 201b projected to an upper end 111b of each terminal slot 11b, and a fixed section 202b being fixed between each stopper 13b and other interior surface of each terminal slot 11b. The solder materials 30b are located under each overflow hole 14b, and received in an accommodating space 12b of each terminal slot 11b. Wherein an upper surface and a lower surface of the solder material 30b receive outside temperature of the insulative housing 10b from the upper opening 111b and a lower opening 112b of each terminal slot, respectively. During the soldering procedure, the solder material 30b automatically flows from the lower opening 112b of each terminal slot 11b into each overflow hole 14b.

Moreover, each of insulative housings 10b has a gap 16b formed between each stopper 13b and the other interior surface of each insulative housing 10b.

Each of terminals 20b has a flat tip that forms an accommodating space 12b with an interior of an insulative housing 10b for receiving a solder material 30b. The overflow holes 14b are formed inside the insulative housing 10b above the solder materials 30b. The overflow holes 14b prevent the adjacent solder materials 30b from contacting with one another. Thereby, short circuit is avoided and electrical performance of the socket connector is ensured.

Figure 10:
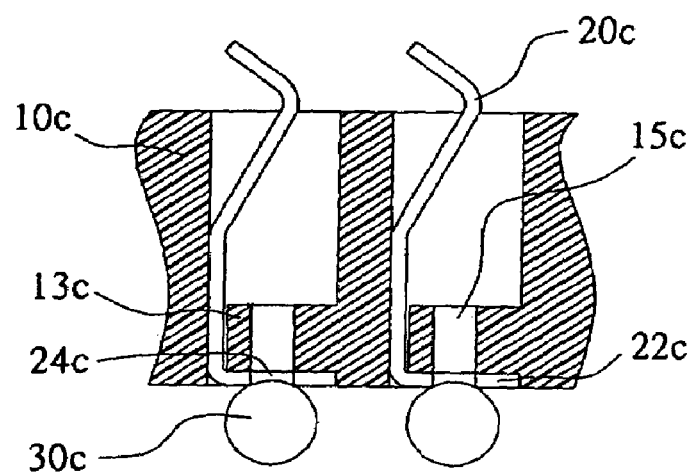
FIG. 10 is a cross-sectional view of a portion of the socket connector according to a third embodiment of the invention.
Figure 11:
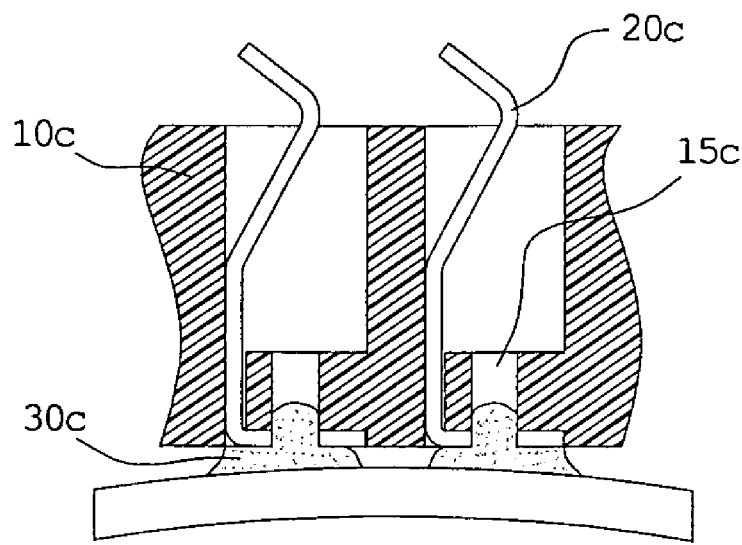
FIG. 11 is a cross-sectional view illustrating the socket connector bonded according to a third embodiment of the invention.

Referring to FIG. 10 and FIG. 11, each of terminals 20 is bent as a solder section 203c. The soldering section 203c is located beneath the insulative housing 10c. A solder material 30c is applied over a bottom of the insulative housing 10c. A through hole 24c is formed approximately at a center of the insulative housing 10c. A stopper 13c is further formed on the bottom of the insulative housing 10c. An overflow hole 14c is formed in the insulative housing 10c to communicate with the through hole 24c. The socket connector of this embodiment also prevents the adjacent solder materials 30c from spreading after being melted, thus preventing a short circuit.

Figure 12:
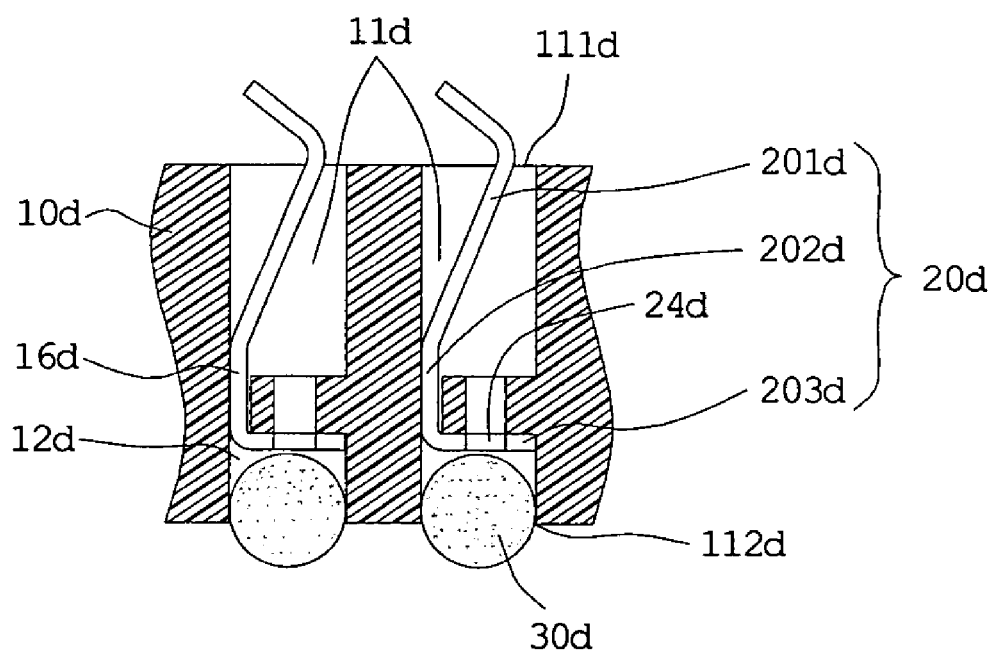
FIG. 12 is a cross-sectional view of a portion of the socket connector according to a fourth embodiment of the invention.

Referring to FIG. 12, the present invention provides a socket connector. The socket connector includes an insulative housing 10d, a plurality of terminals 20d and solder materials 30d. The insulative housing 10d has a plurality of longitudinal terminal slots 11d arranged adjacent to one another, a plurality of stoppers 13d and a plurality of accommodating spaces 12d. Each of the stoppers 13d is protruded inwardly from one interior surface of each terminal slot 11d, and has an overflow hole 14d formed therein. Each of the accommodating spaces 12d are formed in each terminal slot 11d and under each stopper 13d.

Each of the terminals 20d has a contact section 201d projected out an upper opening 111d of each terminal slot 11d, a fixed section 202d being fixed between each stopper 13d and other interior surface of each terminal slot 11d, and a soldering section 203d received in each accommodating space 12d and having a through hole 24d formed thereon. The solder materials are located in each overflow hole 14d, and received in an accommodating space 12d of each terminal slot 11d. Wherein an upper surface and a lower surface of the solder material 30d receive outside temperature of the insulative housing 10d from the upper opening 111d and the lower opening 112d of each terminal slot 11d, respectively. During the soldering procedure, the solder material 30d automatically flows from the lower opening 112d of each terminal slot 11d into each overflow hole 14d.

Moreover, each through hole 24d of the terminals 20d is located below the overflow hole 14d of the corresponding one of the stoppers 13d. Each of insulative housings 10d has a gap 16d formed between each stopper 13d and the other interior surface of each insulative housing 10d.

Referring to FIG. 12, a plurality of solder slots 15d is formed near a bottom of an insulative housing 10d. Each of terminals 20d has a flat tip as a soldering section 203d. The soldering section 203d is secured above the solder slot 15d to contact the solder 30d inside the solder slot 15d. The soldering section 203d has a through hole 24d approximately at a center thereof. A stopper 13d is formed above the solder slot 15d in the insulative housing 10d. An overflow hole 14d is formed above the stopper 13d to communicate with the through hole 24d. The socket connector of this embodiment also prevents the adjacent solder materials 30d from spreading after being melted.

Figure 13:
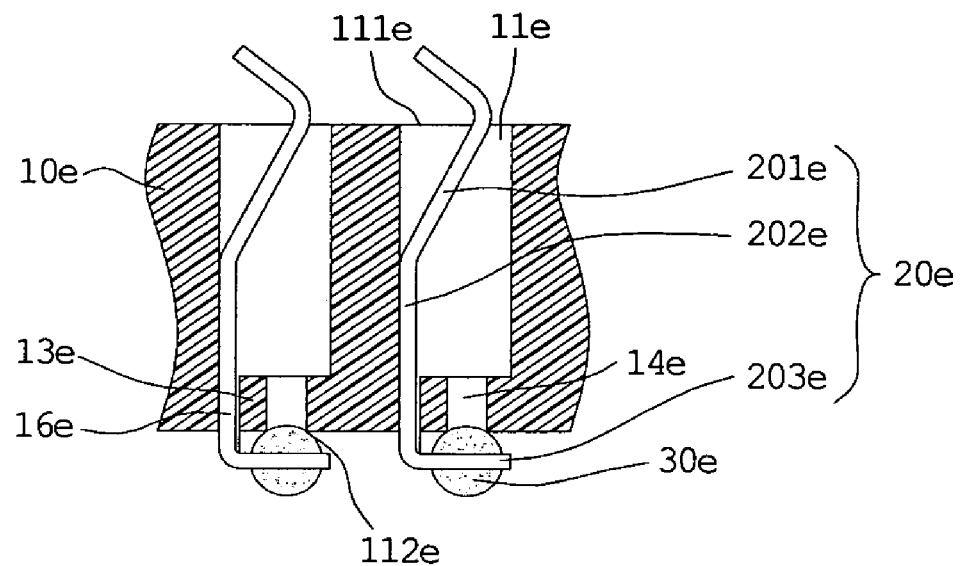
FIG. 13 is a cross-sectional view of a portion of the socket connector according to a fifth embodiment of the invention.

Referring to FIG. 13, the present invention provides a socket connector. The socket connector includes an insulative housing 10e, a plurality of terminals 20e and solder materials 30e. The insulative housing 10e has a plurality of longitudinal terminal slots 11e arranged adjacent to one another, and a plurality of stoppers 13e. Each of the stoppers 13e is protruded inwardly from one interior surface of each terminal slot 11e, and has an overflow hole 14e formed therein.

Each of the terminals 20e has a contact section 201e projected out an upper opening 111e of each terminal slot 11e, a fixed section 202e being fixed between each stopper 13e and other interior surface of each terminal slot 11e, and a soldering section 203e projected out a lower opening 112e of each terminal slot 11e. The solder materials 30e are located in each overflow hole 14e, and covered around each soldering section 203e during a soldering procedure. Wherein, during the soldering procedure, any parts of the solder material 30e are able to receive outside temperature of the insulative housing 10e from the upper opening 111e and the lower opening 112e of each terminal slot 11e, respectively. During the soldering procedure, the solder material 30e automatically flows from the lower opening 112e of each terminal slot 11e into each overflow hole 14e.

Moreover, the solder material 30e extends from within the insulative housing 10e to an exterior of the insulative housing 10e. The soldering section 203e is separated relative to the overflow hole 14e of each stopper 13e to define a gap therebetween. Each of insulative housings has a gap 16e formed between each stopper 13e and the other interior surface of each insulative housing 10e.

Figure 14:
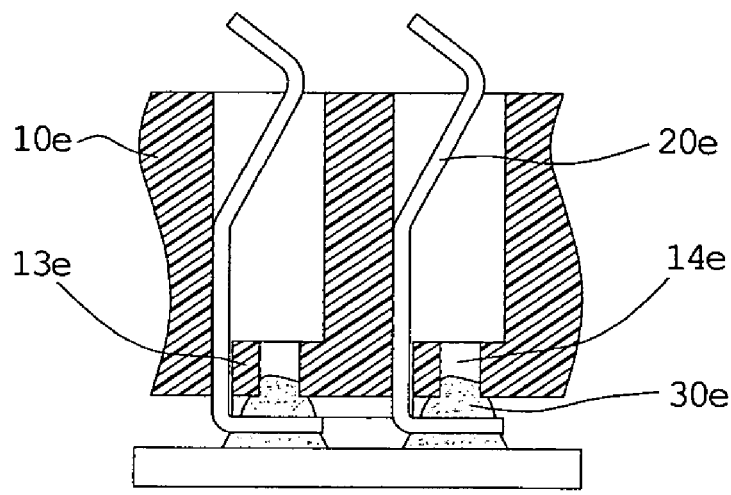
FIG. 14 is a cross-sectional view illustrating the socket connector bonded to a circuit board according to a fifth embodiment of the invention.

Referring to FIG. 13 and FIG. 14, each of terminals 20e is bent horizontally and inserted in a solder material 30e. An overflow hole 14e is formed above the stopper 13e. With the overflow hole 14e, the socket connector prevents the adjacent solder materials 30c from spreading after being melted. Thereby, electrical performance of the socket connector is ensured.

Although the overflow holes in the above embodiments are located above the solder materials, the location of the overflow holes is not particularly limited to the above embodiments.

As described above, the invention is characterized in that the socket connector having a plurality of terminals is further provided with a plurality of overflow holes, particularly in a direction along which the insulative housing and terminals apply pressure on the solder materials.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A socket connector comprising:
   an insulative housing having:
      a plurality of longitudinal terminal slots arranged adjacent to one another; and
      a plurality of stoppers, each of the stoppers protruding inwardly from one interior surface of each terminal slot and having an overflow hole formed therein;
      a plurality of terminals, each of the terminals having a contact section projected to an upper end of each terminal slot, and a fixed section being fixed between each stopper and other interior surface of each terminal slot;
      solder materials located under each overflow hole, and received in an accommodating space of each terminal slot;
      wherein, an upper surface and a lower surface of the solder material receive outside temperature of the insulative housing from the upper opening and a lower opening of each terminal slot, respectively;
      wherein, during the soldering procedure, the solder material automatically flows from the lower opening of each terminal slot into each overflow hole.

2. The socket connector according to claim 1, wherein each of insulative housings has a gap formed between each stopper and the other interior surface of each insulative housing.

* * * * *